United States Patent [19]
Cho

[11] Patent Number: 5,844,848
[45] Date of Patent: Dec. 1, 1998

[54] INTEGRATED CIRCUIT MEMORY DEVICES HAVING IMPROVED DATA MASKING CAPABILITY

[75] Inventor: Il-jae Cho, Kyungki-do, Rep. of Korea

[73] Assignee: Samsung Electronics Co., Ltd., Suwon, Rep. of Korea

[21] Appl. No.: 946,711

[22] Filed: Oct. 8, 1997

[30] Foreign Application Priority Data

Dec. 13, 1996 [KR] Rep. of Korea ............ 9665523

[51] Int. Cl.$^6$ ............................................. G11C 7/00
[52] U.S. Cl. ..................... 365/190; 365/195; 365/202; 365/207
[58] Field of Search ............................ 365/190, 202, 365/207, 195

[56] References Cited

U.S. PATENT DOCUMENTS

| | | | |
|---|---|---|---|
| 5,473,576 | 12/1995 | Matsui | 365/190 X |
| 5,528,551 | 6/1996 | Pinkham | 365/230.06 |
| 5,729,503 | 3/1998 | Manning | 365/230.08 X |

*Primary Examiner*—Do Hyun Yoo
*Attorney, Agent, or Firm*—Myers Bigel Sibley & Sajovec

[57] ABSTRACT

Integrated circuit memory devices having improved data masking capability include a memory cell array having a plurality of bit lines coupled thereto and a first sense amplifier that has first and second inputs that are electrically coupled to first and second input lines, respectively, and at least one output electrically coupled to a first bit line in the plurality thereof. A preferred data driving circuit is also provided that is responsive to a data masking signal so that first and second outputs of the data driving circuit are placed in preferred high impedance states that can be more easily equalized to prevent amplification by a sense amplifier coupled thereto by the first and second input lines. Thus, rather than always having the complementary outputs of the data driving circuit be functionally dependent on the input data, the outputs can be automatically set to high impedance levels that can be more readily equalized and pulled-up or pulled-down to a reference potential, upon application of a data masking signal.

17 Claims, 7 Drawing Sheets

INTEGRATED CIRCUIT MEMORY DEVICES HAVING IMPROVED DATA MASKING CAPABILITY

FIELD OF THE INVENTION

The present invention relates to integrated circuits and more particularly to integrated circuit memory devices.

BACKGROUND OF THE INVENTION

The writing of data into an integrated circuit memory device often includes the writing of least significant and most significant portions of a byte of data into respective portions of a memory cell array. The writing of data also may include operations for masking the writing of certain bits of data within a byte under the control of signals applied to control signal lines.

For example, FIG. 1 illustrates an integrated circuit memory device according to the prior art that includes circuitry therein for performing a masking operation. In particular, the memory device 10 of FIG. 1 includes a memory cell array arranged as a lower byte portion 11 and an upper byte portion 13. The lower byte portion 11 contains a first memory cell array 49 to retain a least significant portion of a byte of data and the upper byte portion 13 contains a second memory cell array 79 to retain a most significant portion of a byte of data. The memory device also contains a plurality of bit lines for providing data to and from the memory cell arrays 49 and 79. The plurality of bit lines may be arranged as a plurality of first and second bit lines electrically coupled to the first and second memory cell arrays 49 and 79, respectively. The plurality of first bit lines are illustrated as bit lines LBL0–LBL3 where the letter "L" stands for "lower" and the plurality of second bit lines are illustrated as bit lines UBL0–UBL3 where the letter "U" stands for "upper". A plurality of sense amplifiers are also provided. In particular, first, second, third and fourth sense amplifiers 41, 43, 45 and 47 are provided in the lower byte portion 11 and fifth, sixth, seventh and eighth sense amplifiers 71, 73, 75 and 77 are provided in the upper byte portion 13. As illustrated, each of the sense amplifiers has first and second complementary outputs that are electrically connected to respective ones of the first and second bit lines LBL0–LBL3 and UBL0–UBL3. A lower pair of input/output lines LIO and LIOB are provided in the lower byte portion 11 and an upper pair of input/output lines UIO and UIOB are provided in the upper byte portion 13.

As illustrated, the lower pair of input/output lines are electrically connected to first and second complementary outputs of a conventional lower input/output driver and equalizer circuit 21 that is more thoroughly illustrated by FIG. 2. The upper pair of input/output lines are electrically connected to first and second complementary outputs of a similar input/output driver and equalizer circuit 51 that is similar in construction to the driver 21 of FIG. 2. A plurality of first NMOS pass transistors 31–38 are also provided in the lower byte portion 11 and a plurality of second NMOS pass transistors 61–68 are provided in the upper byte portion 13. Each of the pass transistors 31–34 is electrically connected in series between an input of a sense amplifier and the input/output line LIOB, and each of the pass transistors 35–38 is electrically connected in series between another input of a corresponding sense amplifier and the input/output line LIO. Each of the pass transistors 61–64 is electrically connected in series between an input of a sense amplifier and the input/output line UIOB, and each of the pass transistors 65–68 is electrically connected in series between another input of a corresponding sense amplifier and the input/output line UIO.

A plurality of control signal lines LCSL0, LCSL1, LCSL2, LCSL3 and UCSL0, UCSL1, UCSL2, UCSL3 are also provided so that input data can be masked in both the lower and upper byte portions 11 and 13 by turning on and off corresponding pass transistors. As will be understood by those skilled in the art, the application of a logic 1 signal (e.g., "high" potential) to a control signal line will cause the pass transistor connected thereto to turn on and pass data from the input/output lines to respective sense amplifiers that amplify the complementary data from the input/output lines and provide the amplified data to corresponding bit lines. However, the application of a logic 0 signal (e.g., "low" potential) to a control signal line will cause the pass transistor connected thereto to turn off and block (i.e., mask) the passage of data from the input/output lines to respective sense amplifiers. Accordingly, the control signal lines and pass transistors can be used to perform masking operations to block transfer of data to the memory cell arrays 49 and 79.

As illustrated by FIG. 2, the lower input/output driver and equalizer circuit 21 contains a plurality of inverters 101, 103, 113 and 119, a pair of 2-input NOR gates 105 and 107, a pair of NMOS pull-down transistors 109 and 115, a pair of PMOS pull-up transistors 111 and 117, an inverter 127 for receiving an external control signal IOPR, a PMOS equalizing transistor 121 and a pair of PMOS pull-up transistors 123 and 125. As illustrated, the driver 21 is responsive to a writing order signal PWR. Here, the application of a logic 1 writing order signal PWR enables the driver 21 to drive the input/output lines LIO and LIOB with complementary versions of the data input signal DIN. In particular, the application of a logic 1 data input signal DIN causes the output of NOR gate 105 to switch to a logic 0 state that turns off the NMOS pull-down transistor 109 and turns off the PMOS pull-up transistor 117 because of the presence of the inverter 119. The application of a logic 1 data input signal DIN also causes the output of inverter 101 to switch to a logic 0 state and the output of NOR gate 107 to switch to a logic 1 state. When the output of the NOR gate 107 switches to a logic 1 state, the NMOS pull-down transistor 115 turns on and pulls the complementary input/output line LIOB to a logic 0 state, and the PMOS pull-up transistor 111 turns on and pulls the input/output line LIO to a logic 1 state. Accordingly, the application of a logic 1 data input signal causes the driver 21 to generate a logic 1 output on the input/output line LIO and a logic 0 output on the complementary input/output line LIOB. Conversely, the application of a logic 0 data input signal causes the driver 21 to generate a logic 0 output on the input/output line LIO and a logic 1 output on the complementary input/output line LIOB. A logic 1 external control signal IOPR can also be used to equalize the potentials on the input/output lines LIO and LIOB at about the power supply potential VDD by turning on PMOS transistors 121, 123 and 125.

Referring now to the timing diagram of FIG. 3, the application of a logic 1 writing order signal PWR enables the driver 21 to produce complementary versions of the data input signal on the input/output lines LIO and LIOB. These complementary signals can then be provided to respective ones of the sense amplifiers 41, 43, 45 and 47 and then amplified and provided to the lower bit lines LBL0–LBL3 as valid data when the corresponding lower control signal line LCSL (LCSL1–LCSL3) is at a logic 1 potential. However, when a lower control signal line is at a logic 0 potential, the corresponding data is masked.

Notwithstanding the above attempt to provide an integrated circuit memory device having a data masking feature, there continues to be a need for integrated circuit memory devices having improved data masking capability.

SUMMARY OF THE INVENTION

It is therefore an object of the present invention to provide improved integrated circuit memory devices.

It is another object of the present invention to provide integrated circuit memory devices having improved data masking capability.

It is still another object of the present invention to provide highly integrated memory devices.

These and other objects, features and advantages of the present invention are provided by integrated circuit memory devices that contain a memory cell array having a plurality of bit lines coupled thereto and a first sense amplifier that has first and second inputs that are electrically coupled to first and second input lines, respectively, and at least one output electrically coupled to a first bit line in the plurality thereof. A preferred data driving circuit is also provided that is responsive to a data masking signal so that first and second outputs of the data driving circuit are placed in preferred high impedance states that can be more easily equalized to prevent amplification by a sense amplifier coupled thereto by the first and second input lines. Thus, rather than always having the complementary outputs of the data driving circuit be functionally dependent on the input data, the outputs can be automatically set to high impedance levels that can be more readily equalized and pulled-up or pulled-down to a reference potential, upon application of a data masking signal.

In particular, according to a preferred aspect of the present invention, driving means is provided that is responsive to a data input signal and a data masking signal. The driving means performs the functions of driving the first and second input lines with complementary versions of the data input signal when the data masking signal is in a first logic state (e.g., logic 0) and disposing the first and second outputs in high impedance states when the data masking signal is in a second logic state (e.g., logic 1). An equalizer that is responsive to the data masking signal is also preferably provided. The equalizer electrically couples the first and second input lines together when the data masking signal is in the second logic state.

According to another embodiment of the present invention, an integrated circuit memory device is provided that uses a reduced number of control signals (and control signal lines) to control the masking of least and most significant bits in a byte of data to be stored in a plurality of memory cells. In particular, preferred memory devices include a memory cell array containing a first memory cell array to retain least significant portions of bytes of data, a second memory cell array to retain most significant portions of bytes of data and a plurality of first and second bit lines electrically coupled to the first and second memory cell arrays, respectively. A first sense amplifier is also provided having first and second inputs electrically coupled to first and second input lines and at least one output electrically coupled to one of the first bit lines. A second sense amplifier is also provided having first and second inputs electrically connected to third and fourth input lines and at least one output electrically coupled to one of the second bit lines. First switching means is also provided. First switching means is responsive to a first control signal and is electrically connected to the first and second input lines and the first and second inputs of the first sense amplifier. First switching means performs the function of masking transfer of complementary data on the first and second input lines to the first and second inputs of the first sense amplifier when the first control signal is in a first logic state (e.g, logic 1) and for passing complementary data on the first and second inputs lines to the first and second inputs of the first sense amplifier when the first control signal is in a second different logic state (e.g., logic 0). Second switching means is also provided. Second switching means is also responsive to the first control signal and is electrically connected to the third and fourth input lines and the first and second inputs of the second sense amplifier. Second switching means performs the function of masking transfer of complementary data on the third and fourth input lines to the first and second inputs of the second sense amplifier when the first control signal is in a first logic state and for passing complementary data on the third and fourth inputs lines to the first and second inputs of the second sense amplifier when the first control signal is in a second logic state. Accordingly, a single control signal can be used to control masking of bits of data in both lower and upper bit portions of a byte of data.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, the terms "first logic state" and "second logic state" refer to opposite binary logic states (e.g., logic 0, logic 1)

Figure 1:
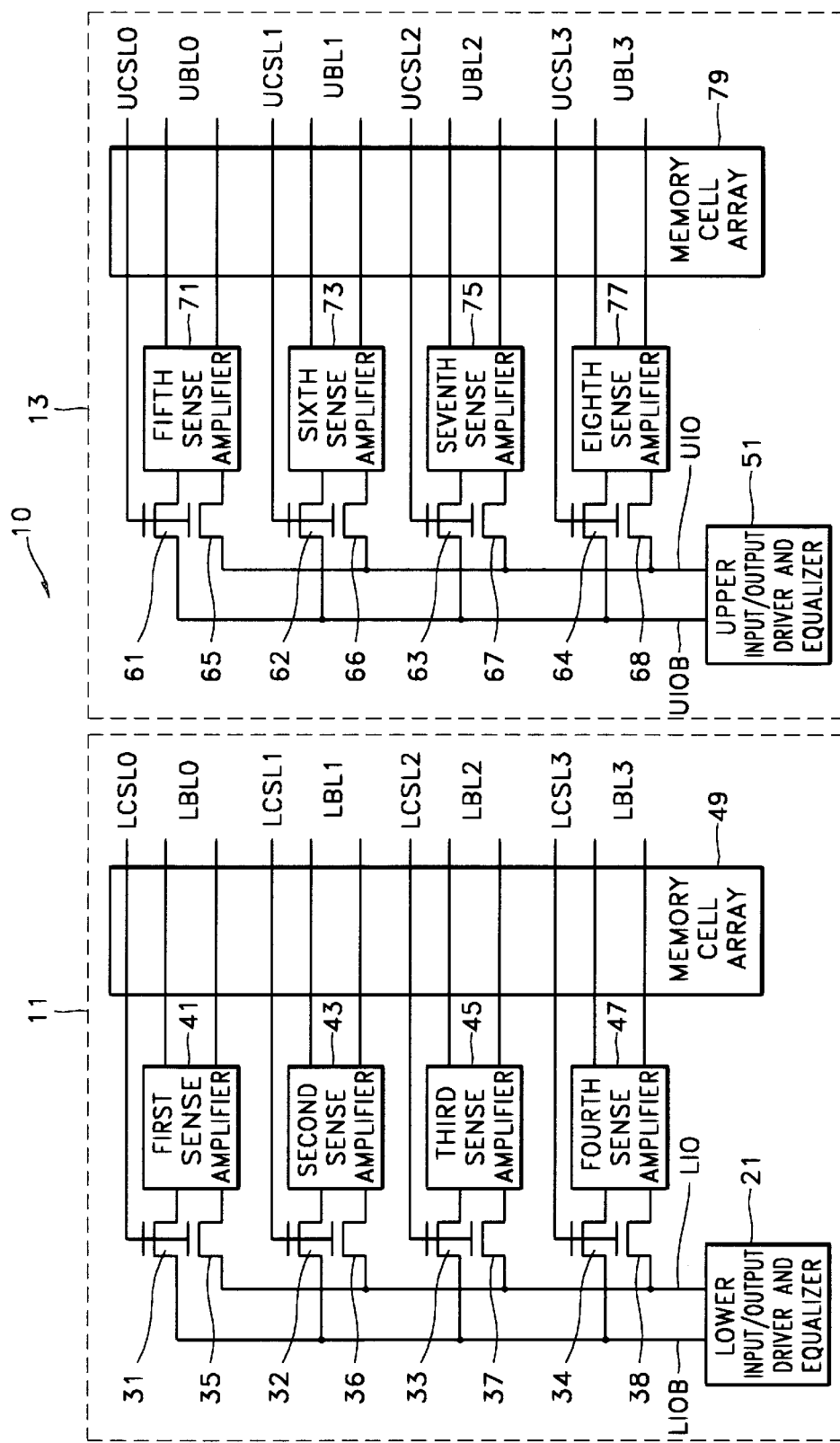
FIG. 1 is an electrical schematic of an integrated circuit memory device according to the prior art.
Figure 2:
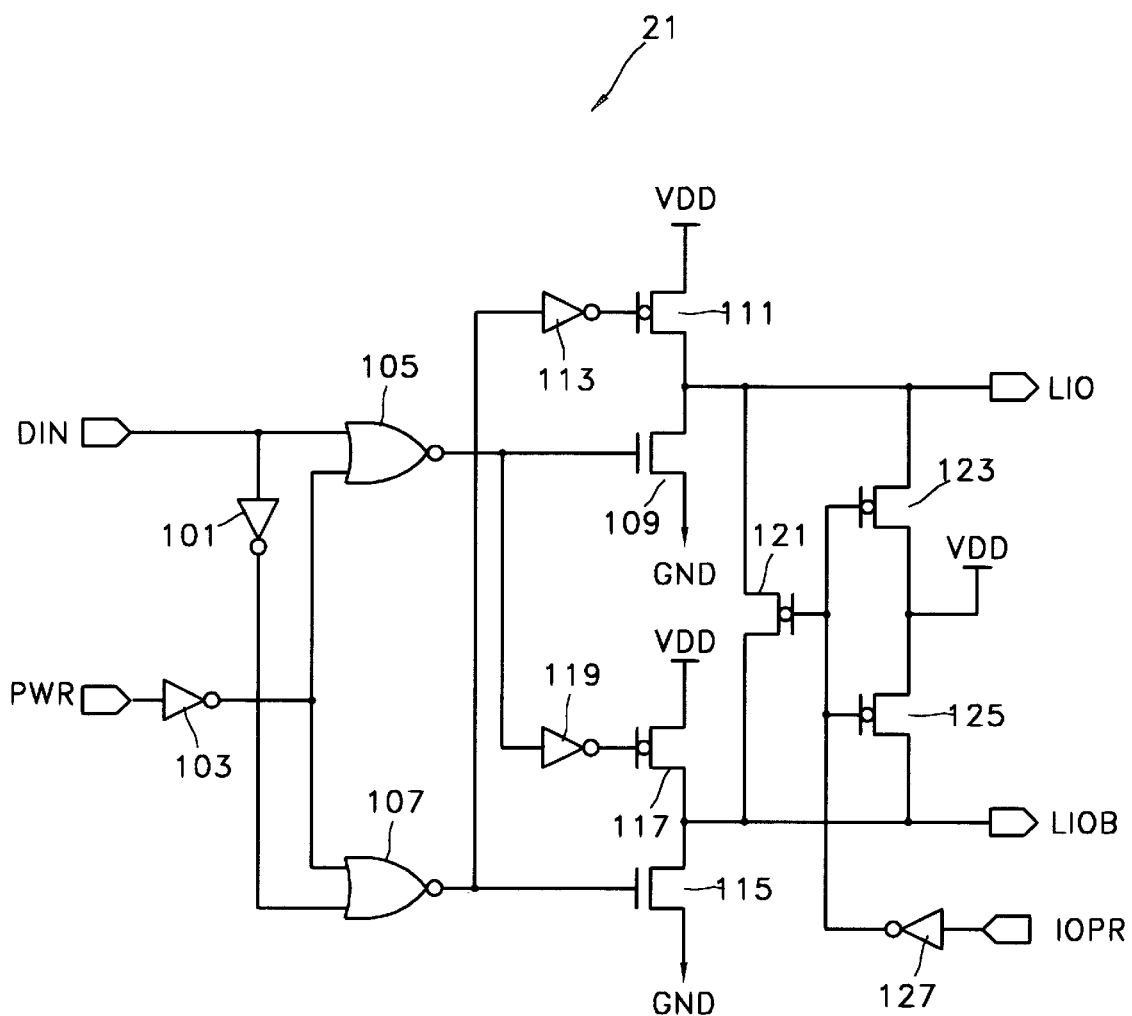
FIG. 2 is an electrical schematic of an input/output driver circuit and equalizer according to the prior art.
Figure 3:
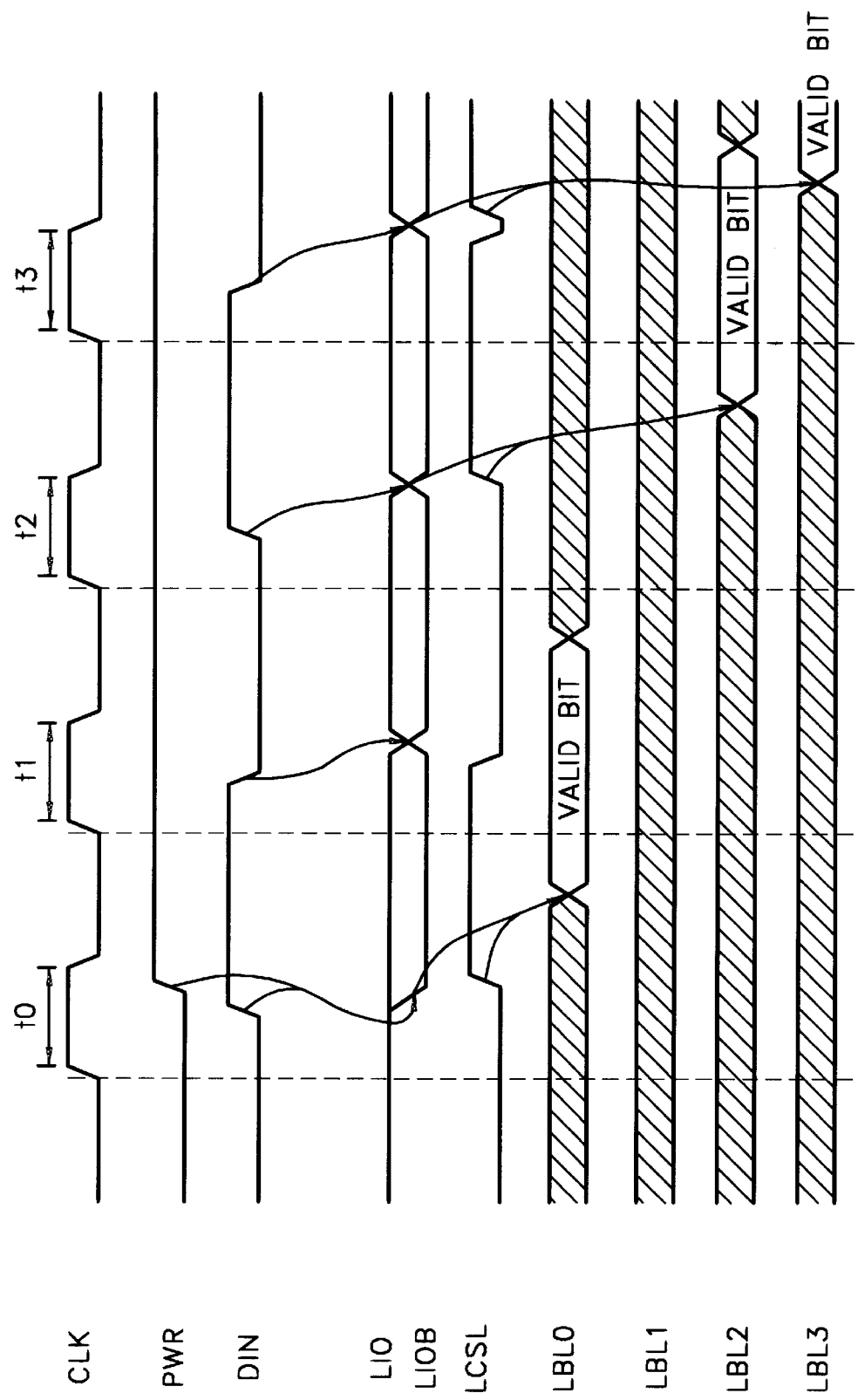
FIG. 3 is a timing diagram that illustrates the operation of the memory device of FIG. 1.
Figure 4:
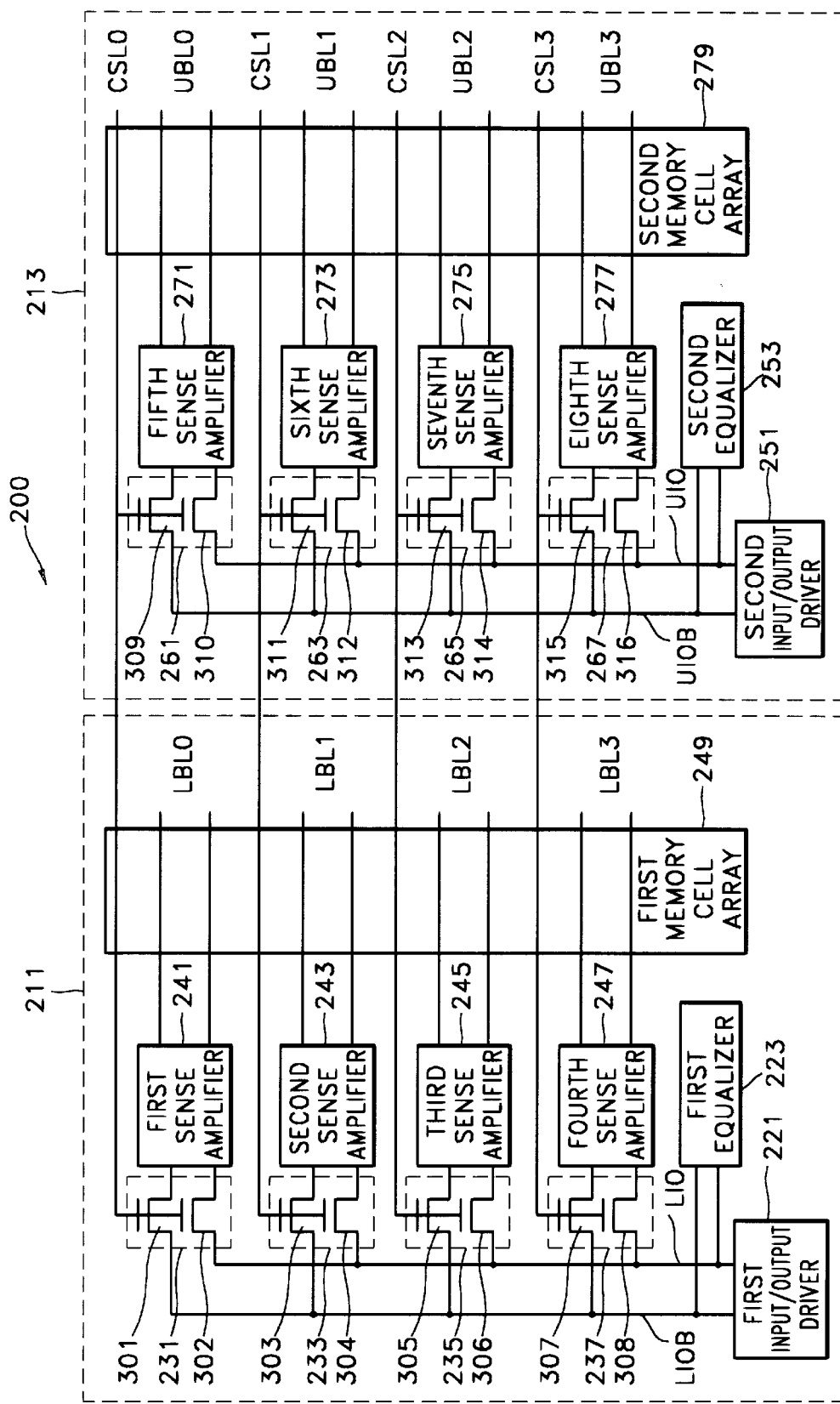
FIG. 4 is an electrical schematic of an integrated circuit memory device according to an embodiment of the present invention.
Figure 6:
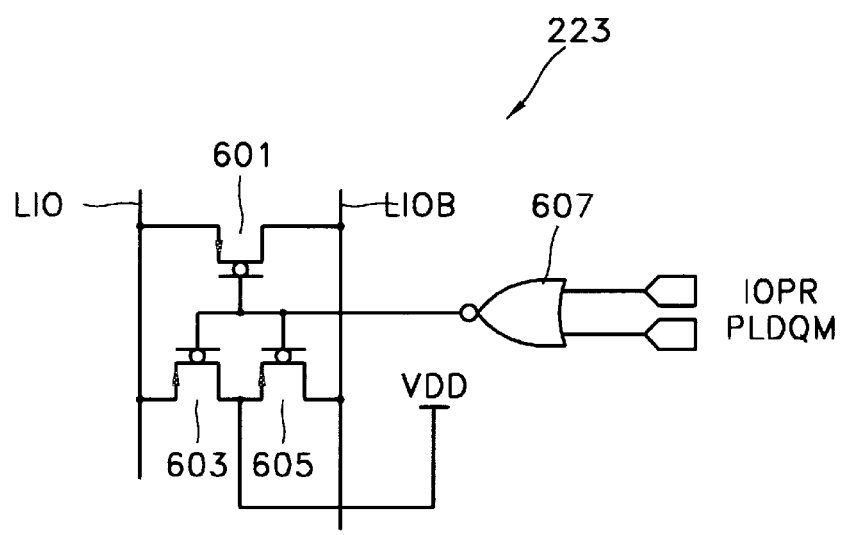
FIG. 6 is an electrical schematic of an equalizer according to an embodiment of the present invention.
Figure 7:
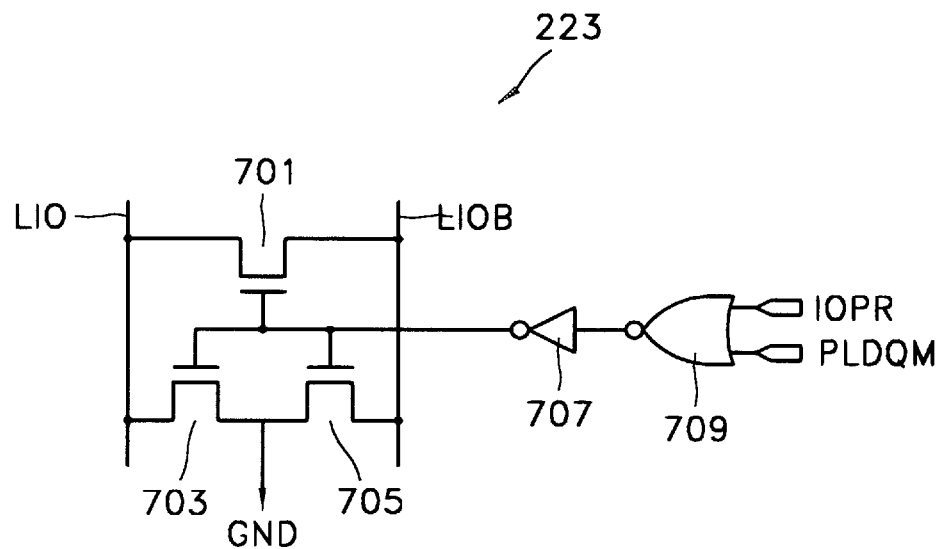
FIG. 7 is an electrical schematic of an equalizer according to another embodiment of the present invention.

Referring now to FIG. 4, a preferred integrated circuit memory device 200 includes a memory cell array arranged as a lower byte portion 211 and an upper byte portion 213. The lower byte portion 211 contains a first memory cell array 249 to retain a least significant portion of a byte of data and the upper byte portions 213 contains a second memory cell array 279 to retain a most significant portion of a byte of data. The memory device also contains a plurality of bit lines for providing data to and from the memory cell arrays 249 and 279. The plurality of bit lines may be arranged as a plurality of first and second bit lines electrically coupled to the first and second memory cell arrays 249 and 279, respectively. The plurality of first bit lines are illustrated as bit lines LBL0–LBL3 where the letter "L" stands for "lower" and the plurality of second bit lines are illustrated as bit lines UBL0–UBL3 where the letter "U" stands for "upper". A plurality of sense amplifiers are also provided. In particular, first, second, third and fourth sense amplifiers 241, 243, 245 and 247 are provided in the lower byte portion 211 and fifth, sixth, seventh and eighth sense amplifiers 271, 273, 275 and 277 are provided in the upper byte portion 213. As illustrated, each of the sense amplifiers has first and second complementary outputs that are electrically connected to respective ones of the first and second bit lines LBL0–LBL3 and UBL0–UBL3. A lower pair of input/output lines LIO and LIOB are provided in the lower byte portion 211 and an upper pair of input/output lines UIO and UIOB are provided in the upper byte portion 213. As illustrated, the lower pair of input/output lines are electrically connected to first and second complementary outputs of a preferred first input/output driver 221 that is more thoroughly illustrated by FIG. 5. The first and second outputs of a first equalizer 223 are also electrically coupled to the lower pair of input/output lines. Preferred embodiments of the first equalizer 223 are illustrated by FIGS. 6–7. The upper pair of input/output lines are electrically connected to first and second complementary outputs of a preferred second input/output driver 251 that is similar in construction to the driver 221 of FIG. 5. The first and second outputs of a second equalizer 253 are also electrically coupled to the upper pair of input/output lines. The preferred embodiments of the second equalizer 253 are similar to the preferred embodiments of the first equalizer 223 illustrated by FIGS. 6–7.

Referring still to FIG. 4, a plurality of first switching devices 231, 233, 235 and 237 are also provided in the lower byte portion 211 and a plurality of second switching devices 261, 263, 265 and 267 are provided in the upper byte portion 213. According to an embodiment of the present invention, each of the first switching devices contains a pair of pass transistors illustrated as NMOS transistors. In each pair, one of the pass transistors 301, 303, 305 and 307 is electrically connected in series between an input of a sense amplifier and the input/output line LIOB, and the other of the pass transistors 302, 304, 306 and 308 is electrically connected in series between another input of a corresponding sense amplifier and the input/output line LIO. Each of the second switching devices also contains a pair of pass transistors illustrated as NMOS transistors. In each pair, one of the pass transistors 309, 311, 313 and 315 is electrically connected in series between an input of a sense amplifier and the input/output line UIOB, and the other of the pass transistors 310, 312, 314 and 316 is electrically connected in series between another input of a corresponding sense amplifier and the input/output line UIO.

According to a preferred aspect of the present invention, a plurality of control signal lines CSL0, CSL1, CSL2 and CSL3 are also provided so that input data can be masked in both the lower and upper byte portions 211 and 213 by turning on and off respective pass transistors in the first and second switching devices. However, rather than providing an individual control signal line to each switching device, each control signal line is electrically coupled to a switching device in the lower byte portion 211 as well as the upper byte portion 213 so that the total number of control signal lines can be reduced and integration levels can be increased. As will be understood by those skilled in the art, the application of a logic 1 signal (e.g., "high" potential) to a control signal line will cause the pass transistors in the switching devices coupled thereto to turn on and pass data from the input/output lines to respective sense amplifiers that amplify the complementary data from the input/output lines and provide the amplified data to corresponding bit lines. In addition, the application of a logic 0 signal (e.g., "low" potential) to a control signal line will cause the pass transistors in the switching device coupled thereto to turn off and block the passage of data from the input/output lines to respective sense amplifiers.

Figure 5:
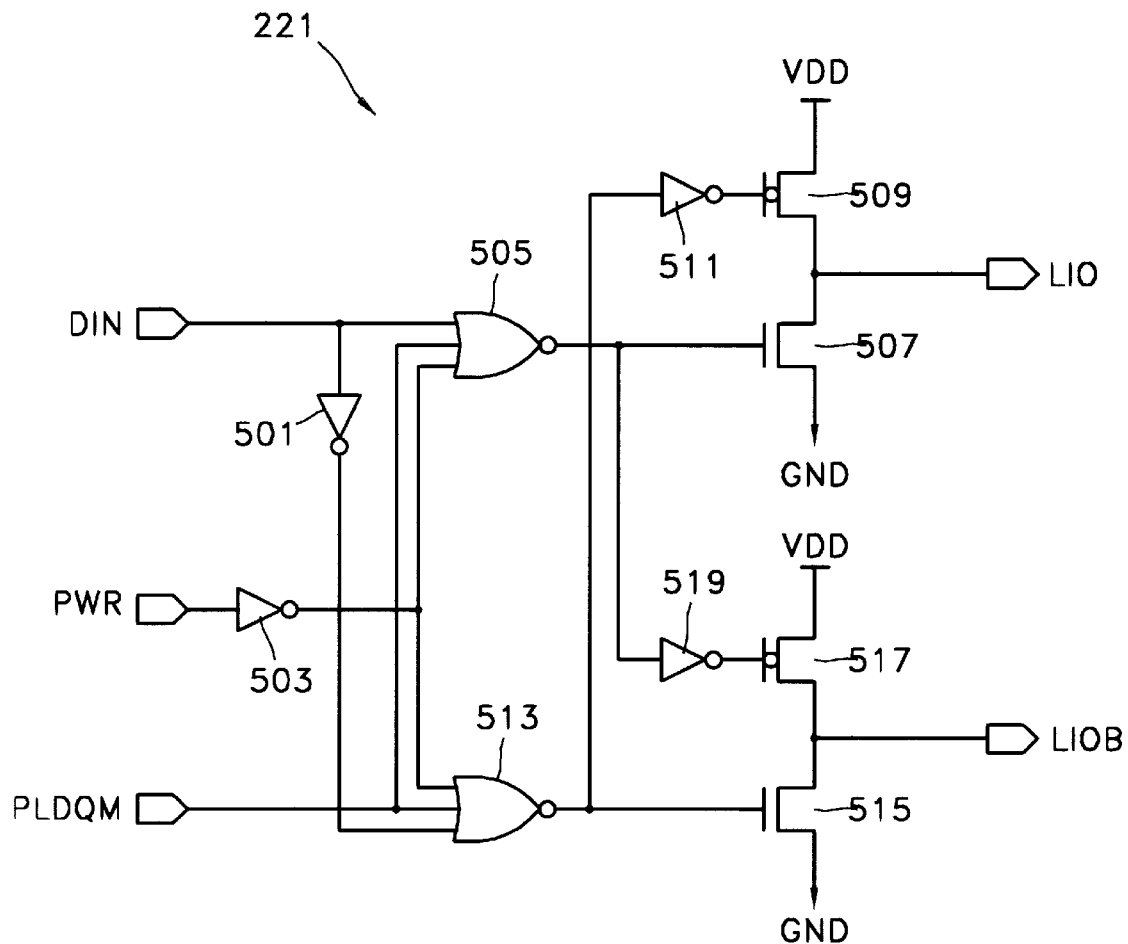
FIG. 5 is an electrical schematic of an input/output driver circuit according to an embodiment of the present invention.

As illustrated best by FIG. 5, a preferred first input/output driver 221 comprises an exemplary means, responsive to a data input signal (DIN) and a data mask signal (PLDQM) and having first and second outputs electrically coupled to first and second input/output lines LIO and LIOB, respectively, for driving the first and second input/output lines with complementary versions of the data input signal DIN when the data mask signal is in a first logic state (e.g., logic 0) and for disposing the first and second outputs in high impedance states when the data mask signal PLDQM is in a second logic state (e.g., logic 1). In particular, the driver 221 of FIG. 5 contains a plurality of inverters 501, 503, 511 and 519, a pair of 3-input NOR gates 505 and 513, a pair of NMOS pull-down transistors 507 and 515 and a pair of PMOS pull-up transistors 509 and 517. As illustrated, the first input/output driver 221 is also responsive to a writing order signal PWR. Here, the application of a logic 0 data mask signal PLDQM and logic 1 writing order signal PWR enables the driver 221 to drive the input/output lines LIO and LIOB with complementary versions of the data input signal DIN. In particular, the application of a logic 1 data input signal DIN causes the output of NOR gate 505 to switch to a logic 0 state that turns off the NMOS pull-down transistor 507 and turns off the PMOS pull-up transistor 517 because of the presence of the inverter 519. The application of a logic 1 data input signal DIN also causes the output of inverter 501 to switch to a logic 0 state and the output of NOR gate 513 to switch to a logic 1 state. When the output of the NOR gate 513 switches to a logic 1 state, the NMOS pull-down transistor 515 turns on and pulls the complementary input/output line LIOB to a logic 0 state, and the PMOS pull-up transistor 509 turns on and pulls the input/output line LIO to a logic 1 state. Accordingly, the application of a logic 1 data input signal causes the driver 221 to generate a logic 1 output on the input/output line LIO and a logic 0 output on the complementary input/output line LIOB. Conversely, the application of a logic 0 data input signal causes the driver 221 to generate a logic 0 output on the input/output line LIO and a logic 1 output on the complementary input/output line LIOB.

In addition, according to a preferred aspect of the present invention, the driver 221 is capable of generating high impedance (e.g., floating) output states when a logic 1 data masking signal PLDQM is provided. In particular, the application of a logic 1 data masking signal PLDQM causes the outputs of the NOR gates 505 and 513 to switch to logic 0 states to turn-off PMOS transistors 509 and 517 and turn-off NMOS transistors 507 and 515 and place the input/output lines LIO and LIOB in high impedance states.

As illustrated best by the equalizer of FIG. 6, the application of a logic 1 data masking signal PLDQM also causes the output of NOR gate 607 to switch low and turn on PMOS transistors 601, 603 and 605. As illustrated by FIG. 7, the equalizer can be formed using NMOS transistors electrically connected to GND instead of PMOS transistors electrically connected to VDD. Accordingly, the equalizer of FIG. 7 includes a NOR gate 709, an inverter 707 and NMOS transistors 701, 703 and 705. Referring again to FIG. 6, the turning on of PMOS transistors 601, 603 and 605 simultaneously equalizes and pulls-up the input/output lines LIO and LIOB to a power supply potential VDD. As will be understood by those skilled in the art, the application of a logic 1 external control signal IOPR to the NOR gate 607 also causes the equalization and pull-up of the input/output lines LIO and LIOB. Thus, a current path may be formed from VDD to GND through transistors 605, 301 and 805 when the first switching device 231 is active and through transistors 605, 303 and 805 when the second switching device 233 is active. Moreover, when LIO and LIOB are pulled to the logic 1 potentials by the equalizer and the NMOS transistors 301 and 302 are turned on, the NMOS transistors 805 and 807 in the sense amplifier are simultaneously turned on and the lines LBL0 and LBL0B are pulled to logic 0 potentials. With the lines LBL0 and LBL0B pulled to logic 0 potentials, the PMOS transistors 801 and 803 are also turned on, and then a current path is formed from VDD to GND via the PMOS transistor 801, LBL0 and NMOS transistor 807, and via the PMOS transistor 803, LBL0B and NMOS transistor 805. Therefore, the lines LBL0 and LBL0B are pulled to a potential of VDD/2 which represents a precharge state. Here, the sizes of PMOS transistor 801 and the NMOS transistor 807 should be the same and the sizes of the PMOS transistor 803 and NMOS transistor 805 should be the same.

Figure 8:
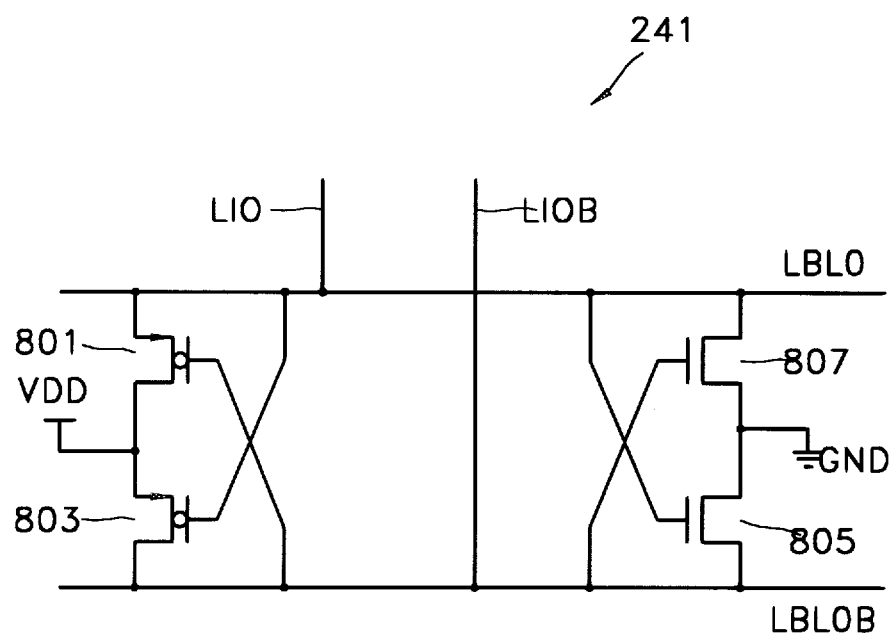
FIG. 8 is an electrical schematic of a sense amplifier used in the memory device of FIG. 4.

According to a preferred aspect of the present invention, the equalization of input/output lines LIO and LIOB at about half the power supply potential causes the masking of data even if, for example, control signal line CSL0 receives a logic 1 potential to turn-on pass transistors 301 and 302 (which are preferably smaller (e.g., narrower) than PMOS transistors 603 and 605). Moreover, the pass transistors within each switching device can be appropriately sized to cause the outputs (e.g., LBL0 and LBL0B) of the corresponding sense amplifier (e.g., 241) to be driven to predetermined levels. Here, as illustrated best by FIG. 8, the first sense amplifier 241 comprises pairs of cross-coupled NMOS and PMOS transistors. As will be understood by those skilled in the art, the establishment of a higher potential at input LI0 relative to input LI0B will turn on NMOS transistor 805 harder than NMOS transistor 807 and thereby pull output LBL0B lower to ground GND. This action turns on PMOS transistor 801 harder than PMOS transistor 803 to thereby drive output LBL0 to VDD and a stable condition can therefore be reached.

Figure 9:
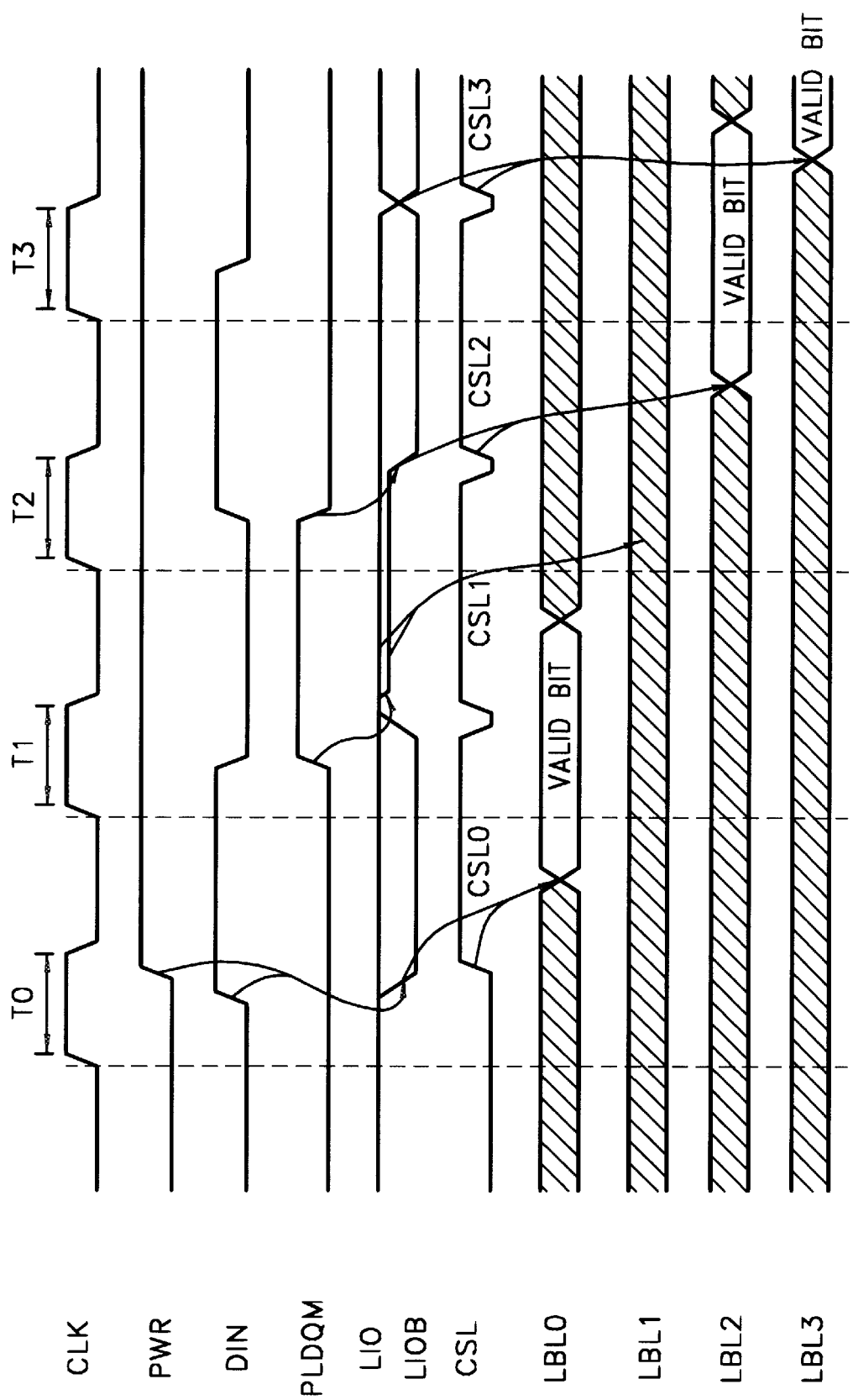
FIG. 9 is a timing diagram that illustrates the operation of the memory device of FIG. 4.

Referring now to the timing diagram of FIG. 9, it can be seen that the application of a logic 1 writing order signal PWR during the time interval T0 when the clock signal CLK is at a logic 1 potential, enables the passing of the logic 1 data input signal DIN to the outputs of the input/output driver 221 as a logic 1 LIO signal and a logic 0 LIOB signal. Also, the application of a logic 1 signal on control signal line CSL0 causes the passing of the LIO and LIOB signals as a first bit of data to the sense amplifier 241. The sense amplifier 241 then generates valid data at the outputs LBL0, as illustrated by FIG. 9, before commencement of the time interval T1. During the time interval T1, the data mask signal PLDQM switches to a logic 1 level. This event causes the first equalizer 223 to pull both input/output lines LIO and LIOB to VDD, as illustrated. During this time period when the data mask signal PLDQM is high, even the application of a logic 1 signal on control signal line CSLL will not result in the transfer of a valid data to the bit lines LBL1. However, the removal of the data mask signal during the time period commencing with interval T2, will again cause the transfer of the next higher order bit of valid data when a logic 1 signal is applied to the control signal line CSL2 and then applied to the control signal line CSL3 during the time period commencing with the interval T3. Accordingly, the present invention provides for the masking of data independent of the switching of independent control signal lines and enables the use of a fewer number of control signal lines to improve integration density.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a memory cell array containing a plurality of bit lines;
   a first sense amplifier having first and second inputs electrically coupled to first and second input lines, respectively, and at least one output electrically coupled to a first bit line in the plurality thereof;
   driving means, responsive to a data input signal and a data masking signal and having first and second outputs electrically coupled to the first and second input lines, respectively, for driving the first and second input lines with complementary versions of the data input signal when the data masking signal is in a first logic state and for disposing the first and second outputs in high impedance states when the data masking signal is in a second logic state; and
   an equalizer, responsive to the data masking signal, to electrically couple the first and second input lines together when the data masking signal is in the second logic state.

2. The memory device of claim 1, wherein said driving means comprises means, responsive to a writing order signal, for disposing the first and second outputs in high impedance states when the writing order signal is in the first logic state.

3. The memory device of claim 2, wherein said driving means comprises first and second NOR gates having respective first inputs electrically coupled to a signal line that receives the data masking signal.

4. The memory device of claim 3, wherein the first and second NOR gates have respective second inputs electrically coupled to a signal line that receives the writing order signal.

5. The memory device of claim 2, further comprising a first pass transistor electrically connected in series between the first input line and the first input of said first sense amplifier and a second pass transistor electrically connected in series between the second input line and the second input of said first sense amplifier.

6. The memory device of claim 5, wherein the first and second pass transistors have control electrodes electrically coupled to a first control signal line; and wherein said memory cell array comprises a first memory cell array to retain a least significant portion of a byte of data and a second memory cell array to retain a most significant portion of the byte of data.

7. The memory device of claim 1, further comprising a first pass transistor electrically connected in series between the first input line and the first input of said first sense amplifier and a second pass transistor electrically connected in series between the second input line and the second input of said first sense amplifier.

8. The memory device of claim 7, wherein the first and second pass transistors have control electrodes electrically coupled to a first control signal line; and wherein said memory cell array comprises a first memory cell array to retain a least significant portion of a byte of data and a second memory cell array to retain a most significant portion of the byte of data.

9. The memory device of claim 8, further comprising:

a second sense amplifier having first and second inputs electrically coupled to third and fourth input lines, respectively, and at least one output coupled to a second bit line in the plurality thereof;

a third pass transistor electrically coupled in series between the third input line and the first input of said second sense amplifier and a fourth pass transistor electrically coupled in series between the fourth input line and the second input of said second sense amplifier; and wherein the third and fourth pass transistors have control electrodes electrically coupled to the first control signal line.

10. The memory device of claim 9, wherein the first memory cell array contains the first bit line and the second memory cell array contains the second bit line.

11. An integrated circuit memory device, comprising:

a memory cell array containing a first memory cell array to retain a least significant portion of a byte of data, a second memory cell array to retain a most significant portion of the byte of data and a plurality of first and second bit lines electrically coupled to the first and second memory cell arrays, respectively;

a first sense amplifier having first and second inputs electrically coupled to first and second input lines and at least one output electrically coupled to one of the first bit lines;

a second sense amplifier having first and second inputs electrically connected to third and fourth input lines and at least one output electrically coupled to one of the second bit lines;

first switching means, responsive to a first control signal and electrically connected to the first and second input lines and the first and second inputs of said first sense amplifier, for masking transfer of complementary data on the first and second input lines to the first and second inputs of said first sense amplifier when the first control signal is in a first logic state and for passing complementary data on the first and second inputs lines to the first and second inputs of said first sense amplifier when the first control signal is in a second logic state; and second switching means, responsive to the first control signal and electrically connected to the third and fourth input lines and the first and second inputs of said second sense amplifier, for masking transfer of complementary data on the third and fourth input lines to the first and second inputs of said second sense amplifier when the first control signal is in the first logic state and for passing complementary data on the third and fourth inputs lines to the first and second inputs of said second sense amplifier when the first control signal is in the second logic state.

12. The memory device of claim 11, further comprising driving means, responsive to a data input signal and a data masking signal and having first and second outputs electrically coupled to the first and second input lines, respectively, for driving the first and second input lines with complementary versions of the data input signal when the data masking signal is in the first logic state and for disposing the first and second outputs in high impedance states when the data masking signal is in the second logic state.

13. The memory device of claim 12, further comprising an equalizer, responsive to the data masking signal, to electrically couple the first and second input lines together when the data masking signal is in the second logic state.

14. The memory device of claim 13, wherein said driving means comprises means, responsive to a writing order signal, for disposing the first and second outputs in high impedance states when the writing order signal is in the first logic state.

15. The memory device of claim 14, wherein said driving means comprises first and second NOR gates having respective first inputs electrically coupled to a signal line that receives the data masking signal.

16. The memory device of claim 15, wherein the first and second NOR gates have respective second inputs electrically coupled to a signal line that receives the writing order signal.

17. The memory device of claim 16, wherein said first switching means comprises a first pass transistor electrically coupled in series between the first input line and the first input of said first sense amplifier and a second pass transistor electrically coupled in series between the second input line and the second input of said first sense amplifier.

* * * * *